United States Patent
Jang

(10) Patent No.: US 9,825,252 B2
(45) Date of Patent: *Nov. 21, 2017

(54) ORGANIC LIGHT-EMITTING DISPLAY APPARATUS AND METHOD OF MANUFACTURING THE SAME

(71) Applicant: SAMSUNG DISPLAY CO., LTD., Yongin-si, Gyeonggi-do (KR)

(72) Inventor: Joonyung Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/004,292

(22) Filed: Jan. 22, 2016

(65) Prior Publication Data

US 2016/0343974 A1 Nov. 24, 2016

(30) Foreign Application Priority Data

May 19, 2015 (KR) .................. 10-2015-0069791

(51) Int. Cl.
*H01L 51/52* (2006.01)
*H01L 27/32* (2006.01)

(52) U.S. Cl.
CPC ...... *H01L 51/5246* (2013.01); *H01L 27/3276* (2013.01)

(58) Field of Classification Search
CPC .................. H01L 51/5246; H01L 27/3276
See application file for complete search history.

(56) References Cited

U.S. PATENT DOCUMENTS

| 7,402,946 | B2 * | 7/2008 | Park | H01L 51/5259 313/498 |
| 7,521,857 | B2 * | 4/2009 | Kang | H01L 51/5246 313/113 |
| 7,990,060 | B2 * | 8/2011 | Ahn | H01L 27/3251 313/512 |
| 8,460,953 | B2 * | 6/2013 | Tanaka | G02F 1/133512 257/E33.067 |
| 8,912,018 | B2 * | 12/2014 | Burrows | H01L 51/5246 257/100 |
| 9,076,745 | B2 * | 7/2015 | Choi | H01L 51/5246 |
| 9,184,224 | B2 * | 11/2015 | Lee | H01L 27/3276 |
| 2006/0221291 | A1 * | 10/2006 | Hong | G02F 1/1341 349/153 |

(Continued)

FOREIGN PATENT DOCUMENTS

| KR | 10-2011-0101906 A | 9/2011 |
| KR | 10-2012-0122227 A | 11/2012 |
| KR | 10-2014-0088737 A | 7/2014 |

*Primary Examiner* — Nicholas Tobergte
(74) *Attorney, Agent, or Firm* — Lewis Roca Rothgerber Christie LLP

(57) ABSTRACT

An organic light-emitting display apparatus includes a lower substrate having a display area and a peripheral area around the display area; an upper substrate facing the lower substrate; a display unit at the display area of the lower substrate; a sealing member at the peripheral area of the lower substrate and configured to bond the lower substrate to the upper substrate; and a first metal layer between the lower substrate and the sealing member and having a plurality of first through portions extending in a first direction.

21 Claims, 9 Drawing Sheets

(56) References Cited

U.S. PATENT DOCUMENTS

| | | | |
|---|---|---|---|
| 2007/0085116 A1* | 4/2007 | Lee | G02F 1/1345 |
| | | | 257/291 |
| 2008/0018843 A1* | 1/2008 | Park | G02F 1/1339 |
| | | | 349/139 |
| 2011/0222015 A1 | 9/2011 | Kang | |
| 2014/0183458 A1 | 7/2014 | Lee et al. | |
| 2015/0001501 A1* | 1/2015 | Cho | H01L 51/5253 |
| | | | 257/40 |

* cited by examiner

ORGANIC LIGHT-EMITTING DISPLAY APPARATUS AND METHOD OF MANUFACTURING THE SAME

CROSS-REFERENCE TO RELATED APPLICATION

This application claims priority to and the benefit of Korean Patent Application No. 10-2015-0069791, filed on May 19, 2015, in the Korean Intellectual Property Office, the disclosure of which is incorporated herein in its entirety by reference.

BACKGROUND

1. Field

One or more exemplary embodiments relate to an organic light-emitting display apparatus and a method of manufacturing the same.

2. Description of the Related Art

From among display apparatuses, an organic light-emitting display apparatus has been considered a next generation display apparatus owing to a wide viewing angle, an excellent contrast, and fast response speed.

In general, an organic light-emitting display apparatus includes thin film transistors and organic light emitting diodes (OLEDs) formed on a substrate so that the OLEDs emit light. Such an organic light-emitting display apparatus may be used as a display in a small appliance such as a mobile phone or as a display of a large appliance such as a television.

An organic light-emitting display apparatus includes a display unit display unit for displaying images between a lower substrate and an upper substrate. The lower substrate and the upper substrate are bonded to each other by a sealing member formed around the display unit, and thus, the display unit may be sealed against the outside.

Recently, research into reducing the dead space formed around the display unit has been actively conducted so as to display images as large as possible with respect to a display panel.

However, according to the above organic light-emitting display apparatus and the method of manufacturing the organic light-emitting display apparatus, when a width of the sealing member is reduced in order to reduce the dead space, a mechanical strength at a bonding surface where the sealing member and the lower substrate are bonded to each other may not be sufficient, thereby reducing a bonding force between the lower substrate and the upper substrate. Accordingly, a sealing property of the display panel degrades.

SUMMARY

One or more exemplary embodiments include an organic light-emitting display apparatus having an improved mechanical strength between a sealing member and a lower substrate and a method of manufacturing the organic light-emitting display apparatus.

Additional aspects will be set forth in part in the description which follows and, in part, will be apparent from the description, or may be learned by practice of the presented embodiments.

According to one or more exemplary embodiments, an organic light-emitting display apparatus includes: a lower substrate having a display area and a peripheral area around the display area; an upper substrate facing the lower substrate; a display unit at the display area of the lower substrate; a sealing member at the peripheral area of the lower substrate and configured to bond the lower substrate to the upper substrate; and a first metal layer between the lower substrate and the sealing member and having a plurality of first through portions extending in a first direction.

The organic light-emitting display apparatus may further include a second metal layer on the first metal layer and having a plurality of second through portions having sizes that are equal to or greater than sizes of the plurality of first through portions.

The organic light-emitting display apparatus may further include a barrier layer between the lower substrate and the first metal layer, and an opening area exposing the lower substrate or the barrier layer at least partially by the plurality of first through portions and the plurality of second through portions.

The organic light-emitting display apparatus may further include a first insulating layer covering the first metal layer, wherein the first insulating layer may cover at least a part of the opening area and has a plurality of first fine holes at the opening area.

The lower substrate or the barrier layer may be exposed at least partially by the plurality of first fine holes.

The sealing member may be embedded in the plurality of first fine holes.

The organic light-emitting display apparatus may further include a second insulating layer on the first insulating layer, wherein the second metal layer may be between the first insulating layer and the second insulating layer.

The second insulating layer may be at the opening area and may have a plurality of second fine holes at the opening area.

The plurality of second fine holes may correspond to the plurality of first fine holes.

The plurality of first through portions may be stripes, each having longer sides and shorter sides.

The first metal layer may include a first edge portion facing an edge of the lower substrate and a second edge portion facing the display unit, and the first edge portion may continuously extend in a second direction that crosses the first direction, in which the plurality of first through portions are arranged.

The second edge portion may continuously extend in the second direction.

The plurality of first through portions may extend toward the second edge portion.

The organic light-emitting display apparatus may further include a second metal layer on the first metal layer.

The display unit may include a thin film transistor including a semiconductor layer and a gate electrode, and the first metal layer may be at a layer at a same level as the gate electrode.

According to one or more exemplary embodiments, a method of manufacturing an organic light-emitting display apparatus is provided. The method includes: preparing a lower substrate having a display area and a peripheral area around the display area; forming a display unit at the display area of the lower substrate; forming a first metal layer having a plurality of first through portions extending in a first direction at the peripheral area of the lower substrate; and locating an upper substrate on the lower substrate, and forming a sealing member at the peripheral area of the lower substrate to bond the lower substrate to the upper substrate.

The method may further include forming a second metal layer having a plurality of second through portions of sizes that are equal to or greater than sizes of the plurality of first through portions on the first metal layer.

The method may further include forming a first insulating layer between the forming of the first metal layer and the forming of the second metal layer, wherein the first insulating layer may cover an opening area exposed by the plurality of first through portions and the plurality of second through portions and has a plurality of first fine holes at the opening area.

The method may further include forming a second insulating layer covering the second metal layer, wherein the second insulating layer may have a plurality of second fine holes at the opening area.

The plurality of first through portions may be stripes, each having longer sides and shorter sides.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
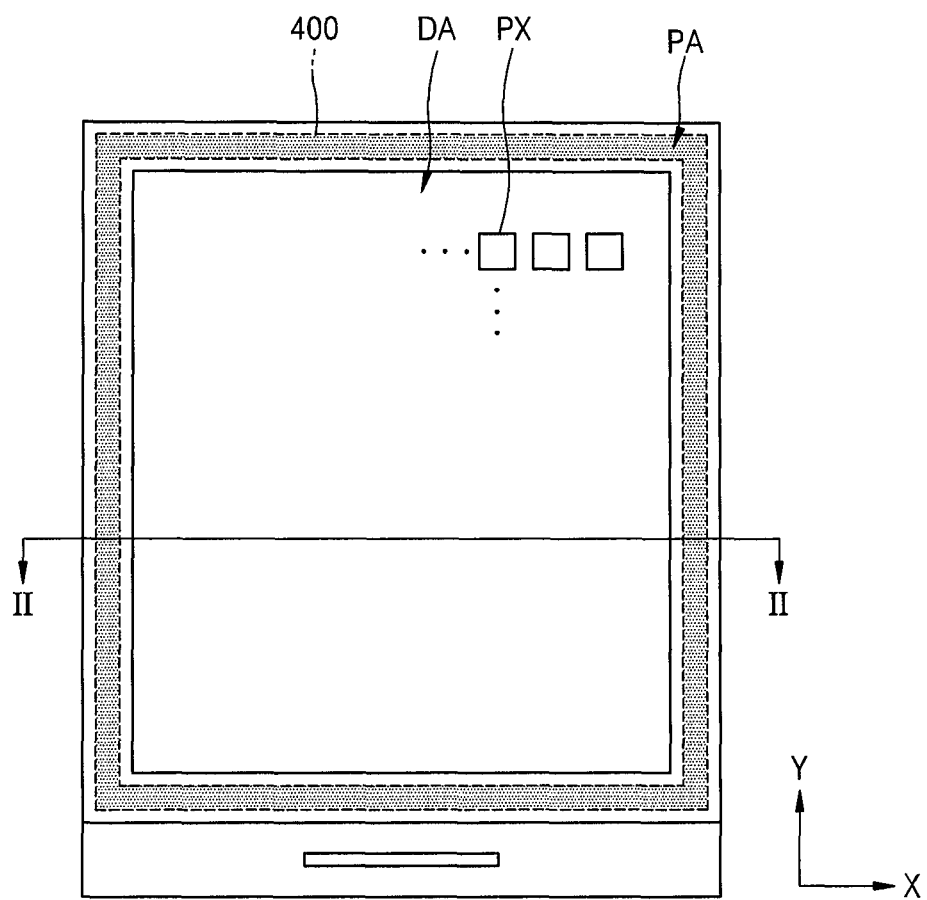
FIG. 1 is a schematic plan view of an organic light-emitting display apparatus according to an exemplary embodiment.

As the present invention allows for various suitable changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope are intended to be encompassed within the present invention. In the description, certain detailed explanations of the related art may be omitted when it is deemed that they may unnecessarily obscure the present invention.

Hereinafter, the present invention will be described in detail by explaining example embodiments of the present invention with reference to the attached drawings. Like reference numbers in the drawings denote like elements (or components).

It will be understood that, although the terms "first", "second", "third", etc., may be used herein to describe various elements, components, regions, layers, and/or sections, these elements, components, regions, layers and/or sections should not be limited by these terms. These terms are used to distinguish one element, component, region, layer or section from another element, component, region, layer or section. Thus, a first element, component, region, layer, or section discussed below could be termed a second element, component, region, layer, or section, without departing from the spirit and scope of the present invention.

The terminology used herein is for the purpose of describing particular embodiments and is not intended to be limiting of the present invention. As used herein, the singular forms "a" and "an" are intended to include the plural forms as well, unless the context clearly indicates otherwise.

It will be further understood that the terms "comprise," "comprises," "comprising," "includes," "including," and "include," when used in this specification, specify the presence of stated features, integers, steps, operations, elements, and/or components, but do not preclude the presence or addition of one or more other features, integers, steps, operations, elements, components, and/or groups thereof.

Sizes of components in the drawings may be exaggerated for convenience of explanation. In other words, because sizes and thicknesses of components in the drawings are arbitrarily illustrated for convenience of explanation, the present invention is not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two or more consecutively described processes may be performed substantially at the same time or performed in an order opposite to the described order.

As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Further, it will also be understood that when one element, component, region, layer and/or section is referred to as being "between" two elements, components, regions, layers, and/or sections, it can be the only element, component, region, layer and/or section between the two elements, components, regions, layers, and/or sections, or one or more intervening elements, components, regions, layers, and/or sections may also be present.

It will be understood that when an element or layer is referred to as being "on," "connected to," "coupled to," "connected with," "coupled with," or "adjacent to" another element or layer, it can be "directly on," "directly connected to," "directly coupled to," "directly connected with," "directly coupled with," or "directly adjacent to" the other element or layer, or one or more intervening elements or layers may be present. Further "connection," "connected," etc. may also refer to "electrical connection," "electrically connect," etc. depending on the context in which they are used as those skilled in the art would appreciate. When an element or layer is referred to as being "directly on," "directly connected to," "directly coupled to," "directly connected with," "directly coupled with," or "immediately adjacent to" another element or layer, there are no intervening elements or layers present.

As used herein, the term "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

Figure 2:
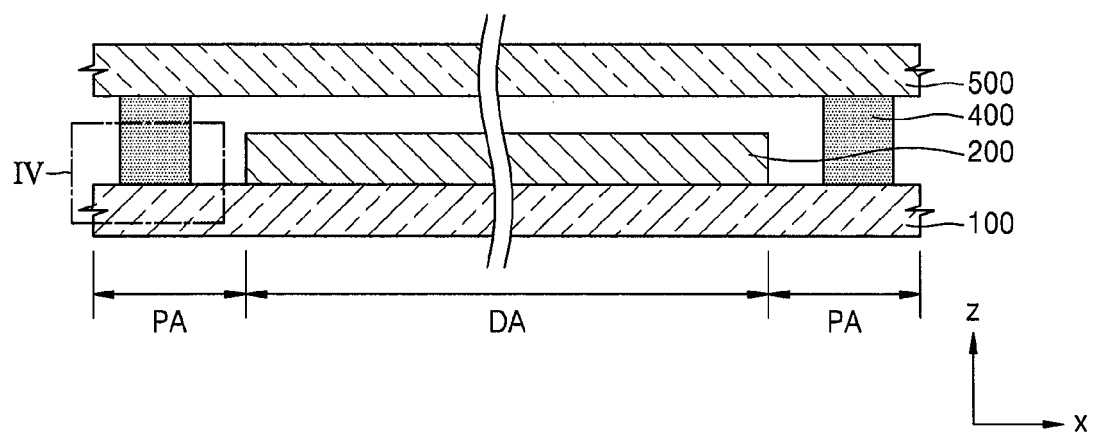
FIG. 2 is a schematic cross-sectional view of the organic light-emitting display apparatus of FIG. 1 taken along the line II-II.

FIG. 1 is a schematic plan view of an organic light-emitting display apparatus according to an exemplary embodiment, and FIG. 2 is a schematic cross-sectional view of the organic light-emitting display apparatus of FIG. 1 taken along the line II-II.

Referring to FIGS. 1 and 2, the organic light-emitting display apparatus according to the exemplary embodiment includes a lower substrate 100, a display unit 200 disposed on the lower substrate 100, a first metal layer 310 (see FIG. 4), a sealing member 400 disposed on the first metal layer 310, and an upper substrate 500 bonded to the lower substrate 100 via the sealing member 400.

The lower substrate 100 may be formed of various suitable materials, e.g., a glass material, a metal material, or a plastic material such as a polyethylene terephthalate (PET), polyethylene naphthalate (PEN), polyimide, etc. The lower substrate 100 may include a display area DA on which the display unit 200 including a plurality of pixels, and a peripheral area PA surrounding the display area DA. The upper substrate 500 may be formed of various suitable materials, e.g., a glass material, a metal material, or a plastic material such as a polyethylene terephthalate (PET), polyethylene naphthalate (PEN), polyimide, etc., like the lower substrate 100. The lower substrate 100 and the upper substrate 500 may be formed of the same or substantially the same material or different materials from each other.

The sealing member 400 may be disposed between the lower substrate 100 and the upper substrate 500. The sealing member 400 may be disposed at the peripheral area PA of the lower substrate 100, and the upper substrate 500 may be bonded to the lower substrate 100 via the sealing member 400 to be sealed. For example, the sealing member 400 may be formed of frit or epoxy, but is not limited thereto.

The display unit 200 may be disposed at the display area DA of the lower substrate 100 and may include a plurality of pixels PX. For example, the display unit 200 may be an organic light-emitting display unit including a plurality of thin film transistors and pixel electrodes connected to the plurality of thin film transistors. In the present exemplary embodiment, a case in which the display unit 200 is an organic light-emitting display unit will be described. Detailed structure of the display unit 200 will be described with reference to FIG. 3.

Figure 3:
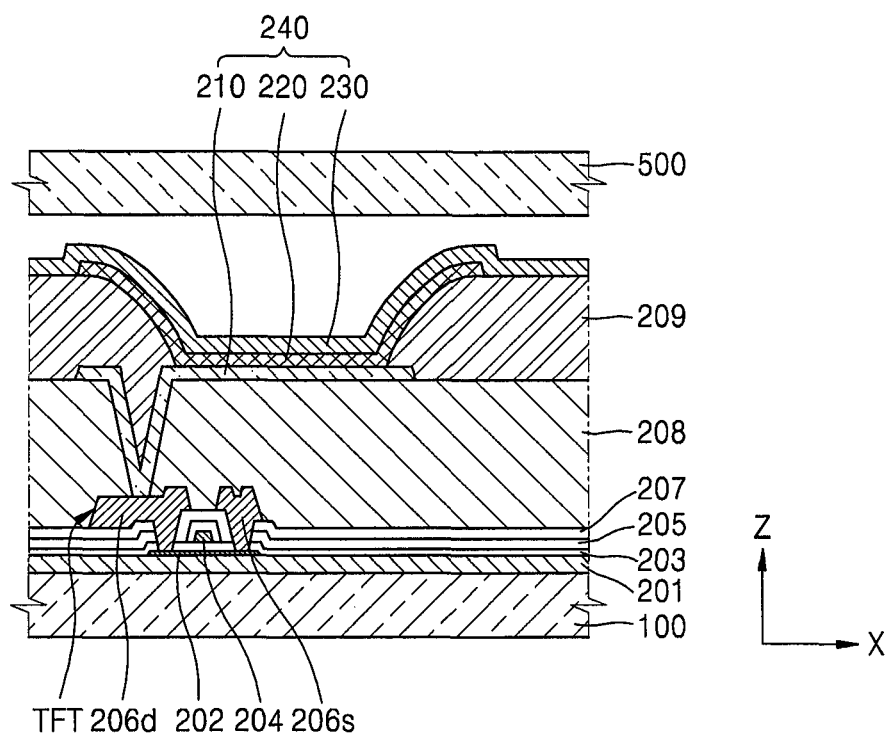
FIG. 3 is a schematic cross-sectional view of a pixel of FIG. 1.

FIG. 3 is a schematic cross-sectional view of the pixel PX of FIG. 1.

Referring to FIG. 3, the display unit 200 may include a thin film transistor TFT, a capacitor, and an organic light-emitting device (OLED) 240 electrically connected to the thin film transistor TFT. While the display apparatus of FIGS. 1 and 2 include a plurality of pixels, FIG. 3 will be described with respect to only one pixel. The thin film transistor TFT may include a semiconductor layer 202 including amorphous silicon, polycrystalline silicon, or an organic semiconductor material, a gate electrode 204, a source electrode 206s, and a drain electrode 206d. Hereinafter, the thin film transistor TFT will be described in detail below.

A barrier layer 201 formed of silicon oxide or silicon nitride may be disposed on the lower substrate 100 in order to planarize a surface of the lower substrate 100 or to prevent or substantially prevent impurities from infiltrating into the semiconductor layer 202 of the thin film transistor TFT, and the semiconductor layer 202 may be located on the barrier layer 201.

The gate electrode 204 is disposed on the semiconductor layer 202, and the source electrode 206s and the drain electrode 206d are electrically connected (i.e., electricity can flow from the source electrode 206s to the drain electrode 206d, and vice versa) according to a signal applied to the gate electrode 204. The gate electrode 204 may be formed of one or more selected from, for example, aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu), as a single-layered or multiple layered structure, in consideration of attachability to adjacent layers, a surface planarization of a stacked layer, and/or processability.

Here, in order to ensure an insulating property between the semiconductor layer 202 and the gate electrode 204, a gate insulating layer 203 formed of silicon oxide and/or silicon nitride may be disposed between the semiconductor layer 202 and the gate electrode 204.

First and second insulating layers 205 and 207 may be disposed on the gate electrode 204, and the first and second insulating layers 205 and 207 may have single-layered structures or multiple layered structures as shown in the drawings by using silicon oxide and/or silicon nitride. When the first and second insulating layers 205 and 207 have the multiple layered structures as described above, the first and second insulating layers 205 and 207 may include the first insulating layer 205 and the second insulating layer 207.

In a case in which the first and second insulating layers 205 and 207 have the multiple layered structures, a conductive layer partially overlapping with the gate electrode 204 may be further disposed on the gate electrode 204 according to a back-plane structure including the thin film transistor TFT according to another exemplary embodiment. The conductive layer may be formed between the first insulating layer 205 and the second insulating layer 207, and in this case, the first insulating layer 205 may function as an insulating layer between the gate electrode 204 and the conductive layer. In the conductive layer formed on the gate electrode 204, the portion overlapping with the gate electrode 204 may function as a capacitor. That is, the gate electrode 204 disposed under the conductive layer functions as a lower electrode of the capacitor and the conductive layer disposed at an upper portion functions as an upper electrode of the capacitor. In this case, the first insulating layer 205 may function as a dielectric layer.

When an additional conductive layer is not formed as described above, a second metal layer 320 (see FIG. 4) that will be described later may be disposed only between the first insulating layer 205 and the second insulating layer 207.

The source electrode 206s and the drain electrode 206d are respectively disposed on the first and second insulating layers 205 and 207. The source electrode 206s and the drain electrode 206d are electrically connected to the semiconductor layer 202 respectively via contact holes formed in the first and second insulating layers 205 and 207 and the gate insulating layer 203. The source electrode 206s and the drain electrode 206d may be formed of one or more selected from Al, Pt, Pd, Ag, Mg, Au, Ni, Nd, Ir, Cr, Li, Ca, Mo, Ti, W, and Cu to have single-layered or multiple layered structures, in consideration of the conductivity.

In addition, a third insulating layer 208 may be disposed on the lower substrate 100. In this case, the third insulating layer 208 may be a planarization layer. The third insulating layer 208 planarizes an upper surface of the thin film transistor TFT and protects the thin film transistor TFT, in a case in which the OLED is disposed on the thin film transistor TFT. The third insulating layer 208 may be formed of, for example, an acryl based organic material or benzocyclobutene (BCB). Here, as shown in FIG. 3, the barrier layer 201, the gate insulating layer 203, and the first and second insulating layers 205 and 207 may be formed on substantially an entire surface of the lower substrate 100.

A fourth insulating layer 209 may be disposed on the thin film transistor TFT. In this case, the fourth insulating layer 209 may be a pixel defining layer. The fourth insulating layer 209 may be located on the third insulating layer 208, and may have an opening exposing a center portion of a pixel electrode 210. The fourth insulating layer 209 defines a pixel region.

The fourth insulating layer 209 may be, for example, an organic insulating layer. The organic insulating layer may include an acryl-based polymer such as poly(methyl methacrylate) (PMMA), polystyrene (PS), polymer derivatives having phenol group, an imide-based polymer, an aryl ether-based polymer, a fluorine-based polymer, a p-xylene-based polymer, a vinylalcohol-based polymer, or mixtures thereof.

In addition, the OLED may be disposed on the third insulating layer 208. The OLED 240 may include the pixel electrode 210, an intermediate layer 220 including an emission layer EML, and an opposite electrode 230.

The pixel electrode 210 may be formed as a (semi) transparent electrode or a reflective electrode. When the pixel electrode 210 is formed as the (semi) transparent electrode, the pixel electrode 210 may be formed of, for example, indium tin oxide (ITO), indium zinc oxide (IZO), ZnO, $In_2O_3$, indium gallium oxide (IGO), and/or AZO. When the pixel electrode 210 may be formed as a reflective electrode, the pixel electrode 210 may have a reflective layer formed of Ag, Mg, Al, Pt, Pd, Au, Ni, Nd, Ir, Cr, or a combination thereof, and a layer formed of ITO, IZO, ZnO, $In_2O_3$, IGO, or AZO. However, the present invention is not limited thereto, and the above layers may be formed of various suitable materials and may have various suitably modified structures.

An intermediate layer 220 may be disposed in each pixel region defined by the fourth insulating layer 209. The intermediate layer 220 includes an emission layer EML for emitting light according to an electric signal, and may further include at least one of a hole injection layer (HIL) and a hole transport layer (HTL) disposed between the emission layer EML and the pixel electrode 210, and an electron transport layer (ETL), and an electron injection layer (EIL) disposed between the emission layer EML and the opposite electrode 230 in a single or multiple layered structures. The intermediate layer 220 is not limited thereto, but may have various suitable structures.

The opposite electrode 230 covering the intermediate layer 220 including the emission layer EML and facing the opposite electrode 210 may be disposed throughout (e.g., over) substantially the entire surface of the lower substrate 100. The opposite electrode 230 may be formed as a (semi) transparent electrode or a reflective electrode:

When the opposite electrode 230 is formed as the (semi) transparent electrode, the opposite electrode 230 may include a layer formed of metal having a small work function, that is, Li, Ca, LiF/Ca, LiF/Al, Al, Ag, Mg, or a combination thereof, and a (semi) transparent conductive layer formed of ITO, IZO, ZnO, or $In_2O_3$. When the opposite electrode 230 is formed as the reflective electrode, the opposite electrode 230 may have a layer formed of Li, Ca, LiF/Ca, LiF/Al, Al, Ag, Mg, or a combination thereof. Materials for forming the opposite electrode 230 and the structure of the opposite electrode 230 are not limited thereto, and the opposite electrode 230 may be modified in various suitable manners.

Figure 4:
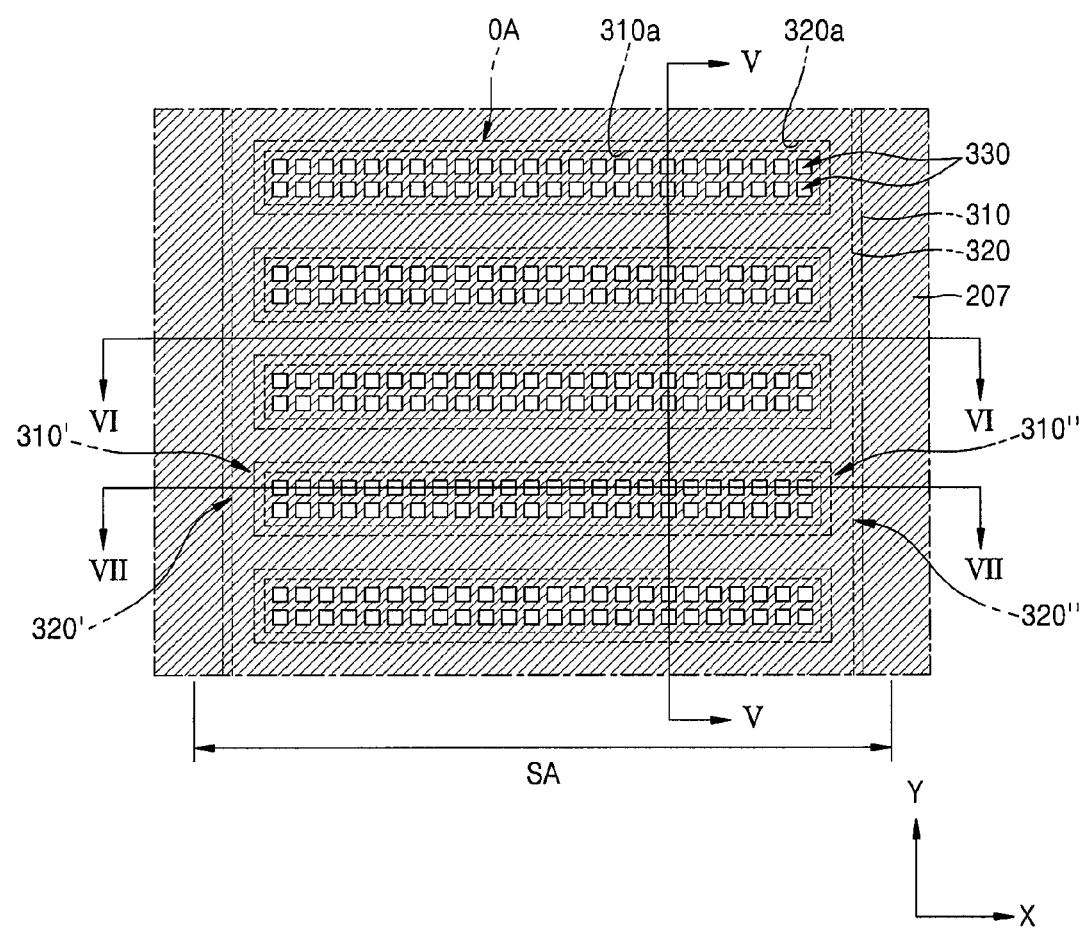
FIG. 4 is a schematic plan view showing an expanded view of a part IV of FIG. 2.

FIG. 4 is a schematic plan view showing an expanded part of a portion IV in FIG. 2. In FIG. 4, for convenience of description, the sealing member 400 is not illustrated and the sealing member 400 may be disposed on the structure shown in FIG. 4. The sealing member 400 may be formed on a sealing area SA.

Referring to FIG. 4, a first metal layer 310 may be disposed at the peripheral area PA of the lower substrate 100, and may be disposed between the lower substrate 100 and the sealing member 400. The first metal layer 310 may have a plurality of first through portions 310a, and the plurality of first through portions 310a may extend along a first direction (e.g., an X-axis direction) as shown in FIG. 4. That is, the plurality of the first through portions 310a may be formed as stripes having longer sides in parallel with each other and shorter sides in parallel with each other. In FIG. 4, the plurality of first through portions 310a are formed in a direction (e.g., an X-axis direction) that is perpendicular to a direction (e.g., a Y-axis direction) in which the first metal layer 310 extends. As another exemplary embodiment, the plurality of first through portions 310a may extend in the direction (e.g., the Y-axis direction) in which the first metal layer 310 extends.

A second metal layer 320 may be further formed on the first metal layer 310, and the second metal layer 320 may be disposed between the first metal layer 310 and the sealing member 400. The second metal layer 320 may have a plurality of second through portions 320a, and the plurality of second through portions 320a may be formed to extend along the first direction (e.g., the X-axis direction) like the plurality of first through portions 310a. Therefore, the second through portions 320a may be formed as stripes having longer sides in parallel with each other and shorter sides in parallel with each other. The second through portions 320a may be formed on locations where the first through portions 310a are formed, and may be formed to have a size equal to or greater than the first through portions 310a. As described above, the second metal layer 320 may be formed only on the first metal layer 310.

An opening area OA exposing at least a part of the lower substrate 100 or the barrier layer 201 may be formed by each of the first through portions 310a of the first metal layer 310 and each of the second through portions 320a of the second metal layer 320. In the present exemplary embodiment, the opening area OA exposes at least a part of the lower substrate 100, but is not limited thereto. As described above, the opening area OA may expose the barrier layer 201 formed on the lower substrate 100.

In addition, the first insulating layer 205 may be disposed between the first metal layer 310 and the second metal layer 320, and the second insulating layer 207 may be disposed between the second metal layer 320 and the sealing member 400. As described above with reference to FIG. 3, the first and second insulating layers 205 and 207 may extend from the display area DA to the peripheral area PA. FIG. 4 shows the second insulating layer 207 disposed on the second metal layer 320. The second insulating layer 207 may be formed to cover the opening area OA, and a plurality of fine holes 330 may be formed in the second insulating layer 207 formed at the opening area OA. A part of the lower substrate 100 may be exposed through the plurality of fine holes 330.

Figure 5:
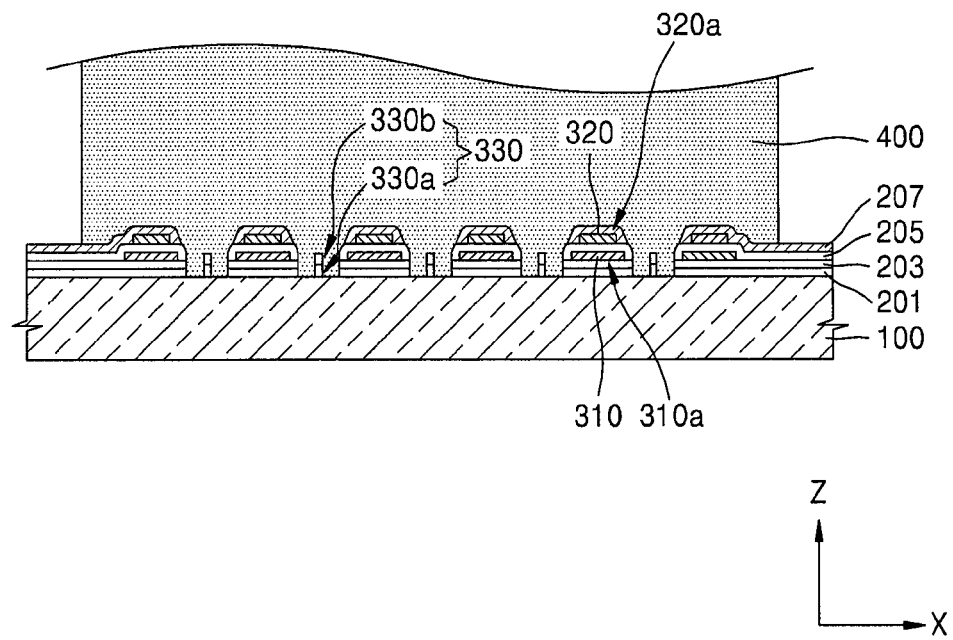
FIG. 5 is a schematic cross-sectional view of the part shown in FIG. 4 taken along the line V-V.

FIG. 5 is a schematic cross-sectional view of the part shown in FIG. 4 taken along the line V-V, and shows a cross-section of the portion in which the first and second through portions 310a and 320a are formed.

Referring to FIGS. 4 and 5, the barrier layer 201 is formed on the lower substrate 100, and the gate insulating layer 203 may be formed on the barrier layer 201. The barrier layer 201 and the gate insulating layer 203 may be formed to extend from the display area DA to the peripheral area PA, that is, throughout (e.g., over) substantially the entire surface of the lower substrate 100.

The first metal layer 310 may be disposed on the gate insulating layer 203, and the first metal layer 310 may have the plurality of first through portions 310a. While forming the first through portions 310a in the first metal layer 310, some parts of the barrier layer 201 and the gate insulating layer 203 formed under the first, metal layer 310 may be removed together. Through the above processes, the first through portions 310a of the first metal layer 310 may form the opening area OA exposing a part of the lower substrate 100. The plurality of fine holes 330 formed by the first and second insulating layers 205 and 207 may be formed at the opening area OA, and the plurality of fine holes 330 may include a plurality of first fine holes 330a formed in the first insulating layer 205 and a plurality of second fine holes 330b formed in the second insulating layer 207.

The first insulating layer 205 may be disposed on the first metal layer 310, and may be formed on (e.g., over) the entire surface of the lower substrate 100. The first insulating layer 205 may be formed at the opening area OA so as to cover at least a part of the opening area OA, and the first insulating layer 205 formed at the opening area OA may include the plurality of first fine holes 330a. In the present exemplary embodiment, a part of the lower substrate 100 may be exposed via the plurality of first fine holes 330a. As another exemplary embodiment, a part of the barrier layer 201 may be exposed.

The second metal layer 320 may be disposed on the first insulating layer 205, and the second metal layer 320 may include the plurality of second through portions 320a. The second through portions 320a formed in the second metal layer 320 may be formed on locations corresponding to the first through portions 310a formed in the first metal layer 310, and may have sizes equal to or greater than those of the first through portions 310a. The opening area OA exposing a part of the lower substrate 100 may be formed via the second through portions 320a.

The second insulating layer 207 may be disposed on the second metal layer 320, and may be formed throughout (e.g., over) substantially the entire surface of the lower substrate 100. The second insulating layer 207 may be formed at the opening area OA so as to cover at least a part of the opening area OA, and the second insulating layer 207 formed at the opening area OA may have the plurality of second fine holes 330b. The plurality of second fine holes 330b may be formed on locations corresponding to the plurality of first fine holes 330a. Therefore, a part of the lower substrate 100 may be exposed by the plurality of second fine holes 330b, and as another exemplary embodiment, a part of the barrier layer 201 may be exposed.

The sealing member 400 may be embedded in the first fine holes 330a and the second fine holes 330b. A contact area of the lower substrate 100 contacting the sealing member 400 may be increased by the first and second fine holes 330a and 330b. In particular, because the plurality of first through portions 310a and the plurality of second through portions 320a are formed to extend continuously, an area in which the fine holes 330 may be formed may be expanded as much as possible so that the contact area between the sealing member 400 and the lower substrate 100 may be increased, thereby improving a bonding strength between the sealing member 400 and the lower substrate 100.

When the first and second through portions 310a and 320a are expanded over the entire first and second metal layers 310 and 320 in order to improve the bonding strength between the sealing member 400 and the lower substrate 100, the opening area OA increases due to the increase in the sizes of the first and second through portions 310a and 320a and the number of first and second fine holes 330a and 330b also increase, and accordingly, the bonding strength between the sealing member 400 and the lower substrate 100 may be improved. However, when the sealing member 400 is formed by laser sealing, rapid heat dissipation is necessary in order to prevent or reduce unevenness of internal heat in the sealing member 400. In addition, when the above structure is formed, a certain area of the first and second metal layers 310 and 320 may not be under the sealing member 400, and accordingly, a defect may occur when the upper and lower substrates 500 and 100 are sealed by the sealing member 400.

Therefore, in the organic light-emitting display apparatus according to the exemplary embodiment, the first and second through portions 310a and 320a that are formed as stripes extending in the first direction (e.g., the X-axis direction) are formed to increase the contact area between the sealing member 400 and the lower substrate 100 as much as possible, and at the same time, the first and second through portions 310a and 320a and the first and second metal layers 310 and 320 are formed alternately with each other as shown in FIG. 5 so that the heat induced in the sealing member 400 during the laser sealing operation may be easily dissipated to the outside by transferring through the first and second through portions 310a and 320a and the first and second metal layers 310 and 320.

Figure 6:
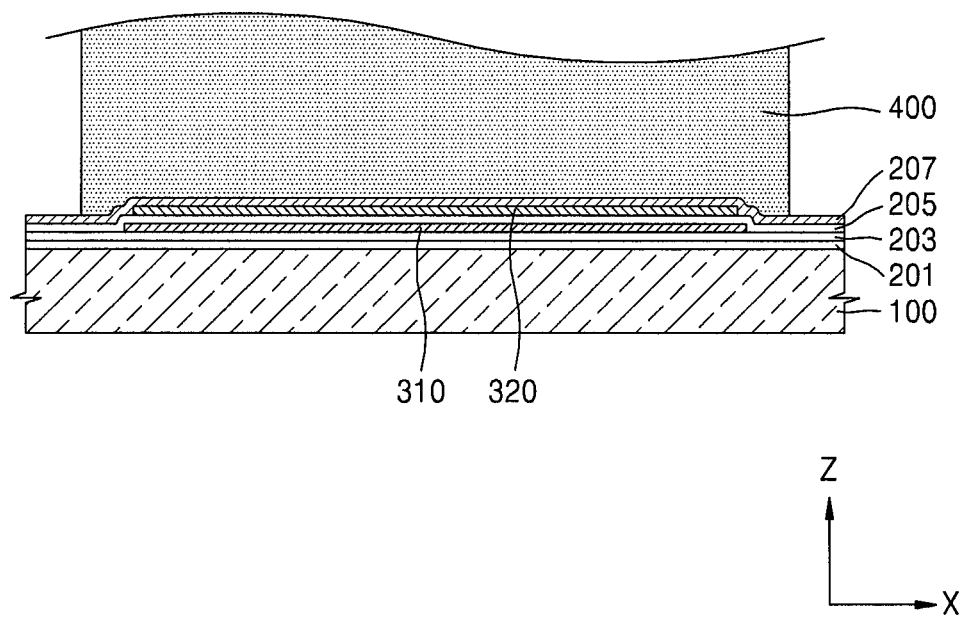
FIG. 6 is a schematic cross-sectional view of the part shown in FIG. 4 taken along the line VI-VI.

FIG. 6 is a schematic cross-sectional view of the structure shown in FIG. 4 taken along the line VI-VI.

Referring to FIGS. 4 and 6, the first and second through portions 310a and 320a extend in the first direction (e.g., the X-axis direction) and may be spaced apart from each other in the other direction (e.g., the Y-axis direction). On the regions formed between the spaced first and second through portions 310a and 320a, the first and second metal layers 310 and 320 may be successively disposed. That is, the regions for forming the first and second metal layers 310 and 320 may be provided at the spaced portions between the first and second through portions 310a and 320a, and thus, the heat generated by the laser sealing may be easily dissipated to the outside.

Figure 7:
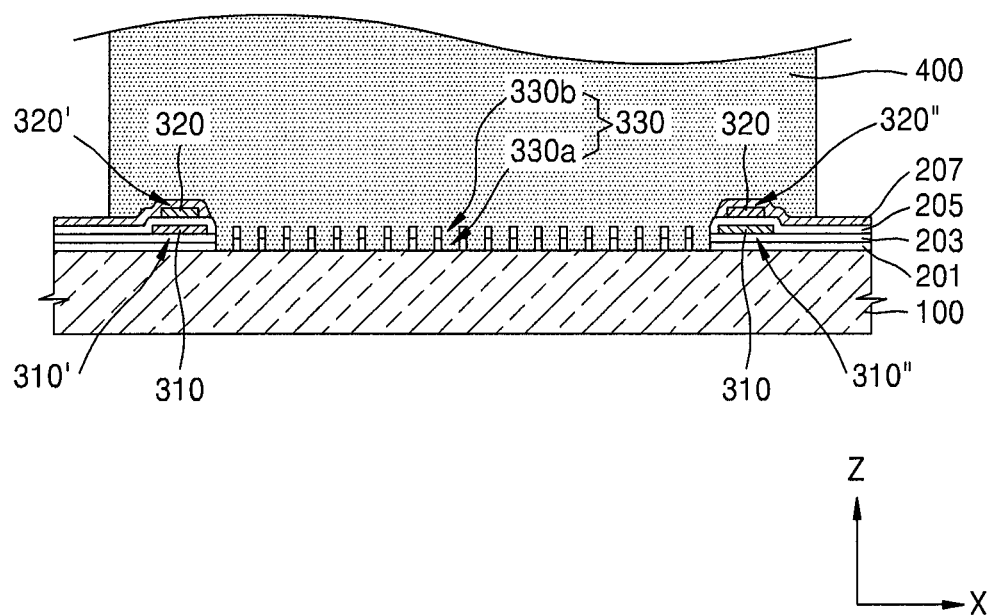
FIG. 7 is a schematic cross-sectional view of the part shown in FIG. 4 taken along the line VII-VII.

FIG. 7 is a schematic-cross-sectional view of the part shown in FIG. 4 taken along the line VII-VII, and shows a cross section along the first direction (e.g., the X-axis direction) in which the first and second through portions 310a and 320a are disposed.

Referring to FIGS. 4 and 7, the first and second insulating layers 205 and 207 may be disposed at the opening area OA in which the first and second through portions 310a and 320a are formed. The first and second insulating layers 205 and 207 disposed at the opening area OA may include the first and second fine holes 330a and 330b. The lower substrate 100 may be partially exposed by the first and second fine holes 330a and 330b.

In addition, the first metal layer 310 may have a first edge portion 310' at a side toward an edge of the lower substrate 100 and a second edge portion 310" at a side toward the display unit 200. The second metal layer 320 formed on the first metal layer 310 may also include a first edge portion 320' at a side toward the edge of the lower substrate 100 and a second edge portion 320" at a side toward the display unit 200, similar to the first metal layer 310.

The first edge portions 310' and 320' and the second edge portions 310" and 320" of the first and second metal layers 310 and 320 may continuously extend along the first direction (e.g., the X-axis direction) formed by the first and second through portions 310a and 320a extended continuously and along the second direction (e.g., the Y-axis) perpendicular to the first direction. Therefore, as shown in FIG. 7, the first and second metal layers 310 and 320 may be disposed on the first edge portions 310' and 320' and the second edge portions 310" and 320", and the first and second metal layers 310 and 320, disposed as above, may provide caps so as to prevent or substantially prevent static electricity from being introduced into the display unit 200. Also, the first and second metal layers 310 and 320, overlaid on the first edge portions 310' and 320' and the second edge portions 310" and 320", form steps which prevent or substantially prevent the sealing member 400 from spreading outside of the sealing area.

Figure 8:
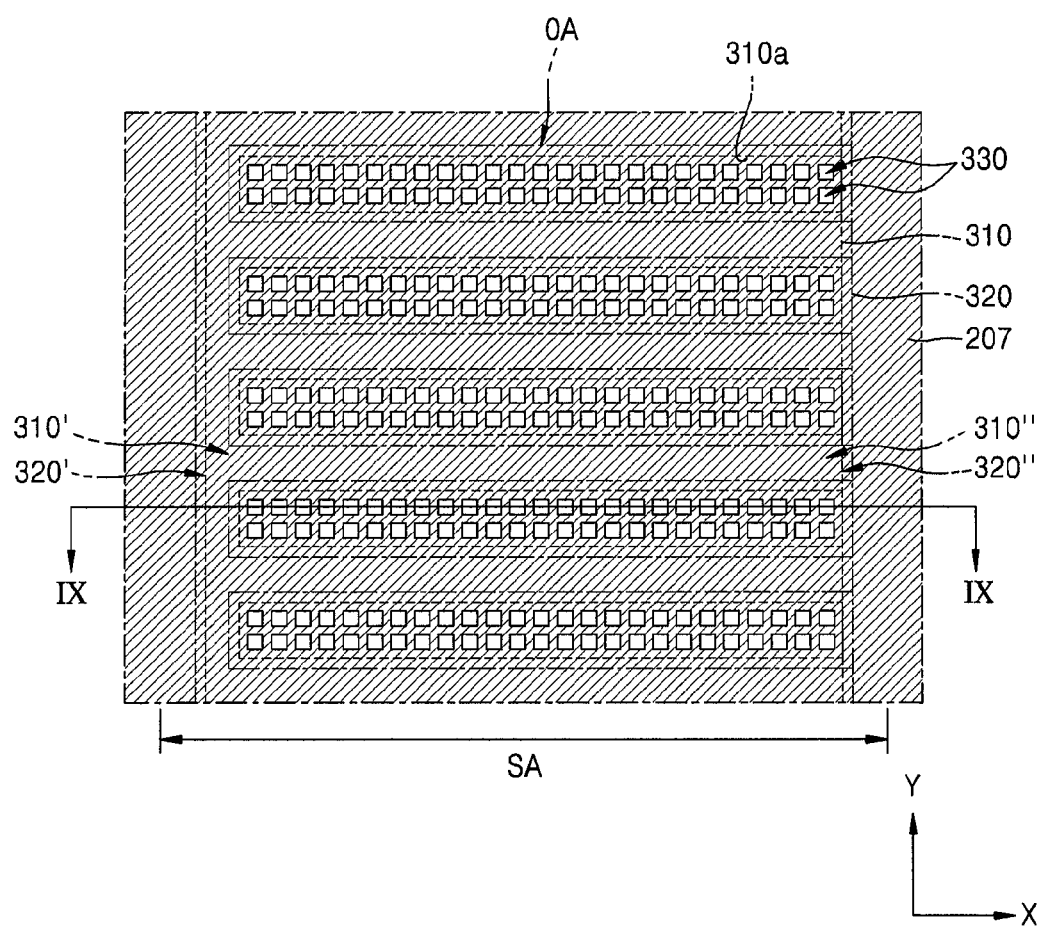
FIG. 8 is a schematic plan view of an organic light-emitting display apparatus according to an exemplary embodiment.
Figure 9:
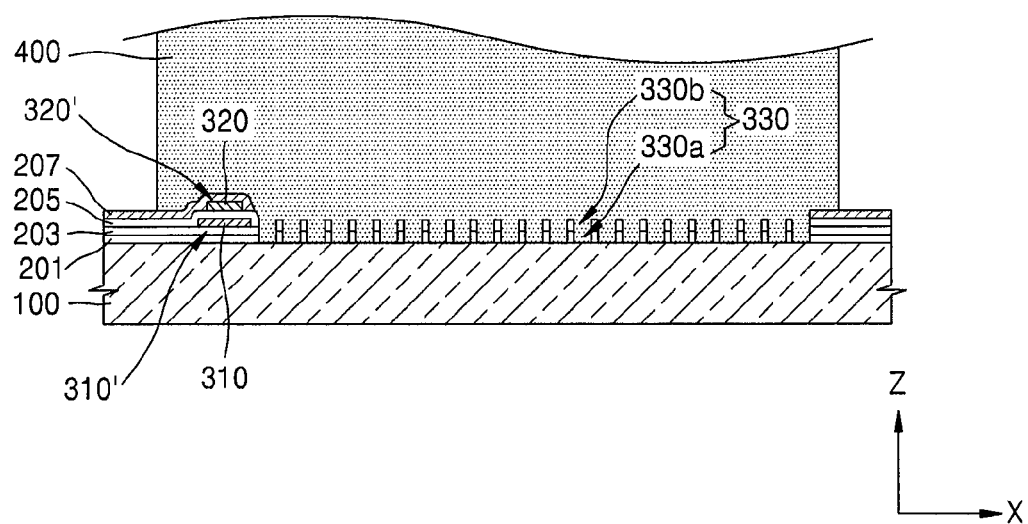
FIG. 9 is a schematic cross-sectional view of the organic light emitting display apparatus of FIG. 8 taken along the line IX-IX.

FIG. 8 is a schematic plan view of an organic light-emitting display apparatus according to another exemplary embodiment, and FIG. 9 is a schematic cross-sectional view of the organic light-emitting display apparatus of FIG. 8 taken along the line IX-IX of FIG. 8. For convenience of description, FIG. 8 does not illustrate the sealing member 400 and the sealing member 400 may be disposed on the structure shown in FIG. 8. The sealing member 400 may be formed on a sealing area SA.

Referring to FIGS. 8 and 9, the first metal layer 310 and the second metal layer 320 may be sequentially disposed at the peripheral area PA, and the first and second metal layers 310 and 320 may be disposed between the lower substrate 100 and the sealing member 400. The first metal layer 310 may have the plurality of first through portions 310a, and the second metal layer 320 may have the plurality of second through portions 320a. The second through portions 320a may correspond to the first through portions 310a. The first and second through portions 310a and 320a may form the opening area OA exposing at least a part of the lower substrate 100 or the barrier layer 201. The first and second through portions 310a and 320a may extend in the first direction (e.g., the X-axis direction) as shown in FIG. 8. The first and second through portions 310a and 320a may be formed as stripes having longer sides in parallel with each other and shorter sides in parallel with each other.

In addition, the first metal layer 310 may have the first edge portion 310' at a side toward the edge of the lower substrate 100 and the second edge portion 310" at a side toward the display unit 200. The second metal layer 320 formed on the first metal layer 310 may have the first edge portion 320' at a side toward the edge of the lower substrate 100 and the second edge portion 320" at a side toward the display unit 200. The first edge portion 310' of the first metal layer 310 and the first edge portion 320' of the second metal layer 320 may extend along the second direction (e.g., the Y-axis direction) crossing the first direction (e.g., the X-axis direction) in which the first and second through portions 310a and 320a extend continuously.

Therefore, as shown in FIG. 8, the first and second metal layers 310 and 320 may be continuously disposed on the first edge portions 310' and 320', and the first and second metal layers 310 and 320, disposed overlapping with each other, may provide caps so as to prevent or substantially prevent static electricity from being introduced into the display unit 200. Also, the first and second metal layers 310 and 320, which are disposed overlapping with each other, form steps so as to prevent or substantially prevent the sealing member 400 from spreading to the edges of the lower substrate 100.

As described above, the first and second metal layers 310 and 320 may be disposed on the first edge portions 310' and 320', while the first and second metal layers 310 and 320 may not be disposed on some parts of the second edge portions 310" and 320". That is, as shown in FIG. 8, the first through portions 310a formed in the first metal layer 310 may extend to the second edge portion 310" to be opened, and the second through portions 320a formed in the second metal layer 320 may extend to the second edge portion 320" to be opened. Therefore, the opening area OA formed by the first and second through portions 310a and 320a may extend to the second edge portions 310" and 320" so as to increase the contact area between the sealing member 400 and the lower substrate 100.

The organic light-emitting display apparatus is described above, but the present invention is not limited thereto. For example, a method of manufacturing the organic light-emitting display apparatus may be included in the scope of the present invention.

Referring to FIGS. 1 to 7, the lower substrate 100 having the display area DA and the peripheral area PA around the display area DA is prepared, and the display unit 200 is formed at the display area DA. The processes of forming the display unit 200 are described above with reference to FIG. 3, and thus, detailed descriptions thereof are omitted.

In addition, the barrier layer 201 and the gate insulating layer 203 may be formed throughout (e.g., over) substantially the entire surface of the lower substrate 100, that is, the barrier layer 201 and the gate insulating layer 203 may be formed at the peripheral area PA, as well as the display area DA. The gate electrode 204 of the thin film transistor TFT, may be formed on the gate insulating layer 203 formed at the display area DA. In addition, the first metal layer 310 having the plurality of first through portions 310a may be formed at the peripheral area PA of the lower substrate 100. Therefore, the gate electrode 204 and the first metal layer 310 may be formed of the same or substantially the same material at the same layer as each other.

The plurality of first through portions 310a formed in the first metal layer 310 may be formed at the peripheral area PA of the lower substrate 100 along the first direction (e.g., the X-axis direction). In FIG. 4, the first through portions 310a are formed in the direction (e.g., the X-axis direction) that is perpendicular to the direction (e.g., the Y-axis direction) in which the first metal layer 310 extends, but the first through portions 310a may extend in the direction (e.g., the Y-axis direction) in which the first metal layer 310 extends. The first through portions 310a may be formed as stripes having longer sides and shorter sides.

The gate insulating layer 203 may be exposed by the plurality of first through portions 310a. Also, the plurality of first through portions 310a may expose the barrier layer 201 or the lower substrate 100 to outside at the time of being patterned or through additional processes. As described above, the opening area OA may be formed by the plurality of first through portions 310a.

After that, the first insulating layer 205 may be formed on (e.g., over) the entire surface of the lower substrate 100. The first insulating layer 205 may cover the gate electrode 204 at the display area DA, and may cover the first metal layer 310 at the peripheral area PA. The first insulating layer 205 formed at the opening area OA exposed by the plurality of first through portions 310a may have the plurality of first fine holes 330a. The lower substrate 100 or the barrier layer 201 may be exposed at least partially by the plurality of first fine holes 330a.

The second metal layer 320 may be formed on the first insulating layer 205 formed at the peripheral area PA. The second metal layer 320 may be patterned to be the same or substantially the same as the first metal layer 310 so as to be formed at the same or substantially the same location as the first metal layer 310. That is, the second metal layer 320 may include the plurality of second through portions 320a corresponding to the plurality of first through portions 310a. The plurality of second through portions 320a may have sizes that are equal to or greater than those of the plurality of first through portions 310a.

After that, the second insulating layer 207 may be further disposed on the second metal layer 320. The second insulating layer 207 formed at the opening area OA exposed by the plurality of second through portions 320a may have the plurality of second-fine holes 330b. The plurality of second fine holes 330b may be formed at the same or substantially the same locations as those of the plurality of first fine holes 330a. As another exemplary embodiment, the plurality of first fine holes 330a and the plurality of second fine holes 330b may not be separately formed, but may be concurrently (e.g., simultaneously) formed through an etching process.

After that, the display unit 200 is formed at the display area DA, and the sealing member 400 may be formed at the peripheral area PA of the lower substrate 100. Here, the sealing member 400 may be embedded in the plurality of first fine holes 330a and the plurality of second fine holes 330b. As described above, because the plurality of first through portions 310a and the plurality of second through portions 320a are continuously formed, an area in which the first and second fine holes 330a and 330b may be formed is expanded as much as possible. Accordingly, a contacting area between the sealing member 400 and the lower substrate 100 is increased as much as possible, thereby improving a bonding strength between the sealing member 400 and the lower substrate 100.

In addition, after forming the sealing member 400 at the peripheral area PA of the lower substrate 100, the upper substrate 500 may be bonded onto the lower substrate 100. Because the lower substrate 100 and the upper substrate 500 are bonded to each other via the sealing member 400, the display unit 200 may be sealed against the outside.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various suitable changes in form and details may be made therein without departing from the spirit and scope as defined by the following claims and their equivalents.

What is claimed is:

1. An organic light-emitting display apparatus comprising:
    a lower substrate having a display area and a peripheral area around the display area;
    an upper substrate facing the lower substrate;
    a display unit at the display area of the lower substrate;
    a sealing member at the peripheral area of the lower substrate and configured to bond the lower substrate to the upper substrate;
    a first metal layer between the lower substrate and the sealing member and having a plurality of first through portions extending in a first direction; and
    a second metal layer on the first metal layer and having a plurality of second through portions.

2. The organic light-emitting display apparatus of claim 1, wherein the plurality of second through portions have sizes that are equal to or greater than sizes of the plurality of first through portions.

3. The organic light-emitting display apparatus of claim 2, further comprising
    a barrier layer between the lower substrate and the first metal layer,
    wherein an opening area exposing the lower substrate or the barrier layer is at least partially formed by the plurality of first through portions and the plurality of second through portions.

4. The organic light-emitting display apparatus of claim 3, further comprising
    a first insulating layer covering the first metal layer,
    wherein the first insulating layer covers at least a part of the opening area and has a plurality of first fine holes at the opening area.

5. The organic light-emitting display apparatus of claim 4, wherein the lower substrate or the barrier layer is exposed at least partially by the plurality of first fine holes.

6. The organic light-emitting display apparatus of claim 4, wherein the sealing member is embedded in the plurality of first fine holes.

7. The organic light-emitting display apparatus of claim 4, further comprising
    a second insulating layer on the first insulating layer,
    wherein the second metal layer is between the first insulating layer and the second insulating layer.

8. The organic light-emitting display apparatus of claim 7, wherein the second insulating layer is at the opening area and has a plurality of second fine holes at the opening area.

9. The organic light-emitting display apparatus of claim 8, wherein the plurality of second fine holes correspond to the plurality of first fine holes.

10. The organic light-emitting display apparatus of claim 1,
wherein the plurality of first through portions are stripes, each having longer sides and shorter sides.

11. The organic light-emitting display apparatus of claim 1,
wherein the first metal layer comprises:
a first edge portion facing an edge of the lower substrate; and
a second edge portion facing the display unit, and
wherein the first edge portion continuously extends in a second direction that crosses the first direction, in which the plurality of first through portions are arranged.

12. The organic light-emitting display apparatus of claim 11,
wherein the second edge portion continuously extends in the second direction.

13. The organic light-emitting display apparatus of claim 11,
wherein the plurality of first through portions extend toward the second edge portion.

14. The organic light-emitting display apparatus of claim 1,
wherein the display unit comprises
a thin film transistor comprising:
a semiconductor layer; and
a gate electrode, and
wherein the first metal layer is at a layer at a same level as the gate electrode.

15. An organic light-emitting display apparatus comprising:
a lower substrate having a display area and a peripheral area around the display area;
an upper substrate facing the lower substrate;
a display unit at the display area of the lower substrate;
a sealing member at the peripheral area of the lower substrate and configured to bond the lower substrate to the upper substrate; and
a first metal layer between the lower substrate and the sealing member and having a plurality of first through portions extending in a first direction,
wherein the display unit comprises a thin film transistor comprising:
a semiconductor layer; and
a gate electrode, and
wherein the first metal layer is at a layer at a same level as the gate electrode.

16. The organic light-emitting display apparatus of claim 15, wherein the plurality of first through portions are stripes, each having longer sides and shorter sides.

17. The organic light-emitting display apparatus of claim 15, further comprising a second metal layer on the first metal layer and having a plurality of second through portions having sizes that are equal to or greater than sizes of the plurality of first through portions.

18. An organic light-emitting display apparatus comprising:
a lower substrate having a display area and a peripheral area around the display area;
an upper substrate facing the lower substrate;
a display unit at the display area of the lower substrate;
a sealing member at the peripheral area of the lower substrate and configured to bond the lower substrate to the upper substrate; and
a first metal layer between the lower substrate and the sealing member and having a plurality of first through portions extending in a first direction, the first metal layer comprises:
a first edge portion facing an edge of the lower substrate; and
a second edge portion facing the display unit, and
wherein the first edge portion continuously extends in a second direction that crosses the first direction, in which the plurality of first through portions are arranged.

19. The organic light-emitting display apparatus of claim 18,
wherein the second edge portion continuously extends in the second direction.

20. The organic light-emitting display apparatus of claim 18,
wherein the plurality of first through portions extend toward the second edge portion.

21. The organic light-emitting display apparatus of claim 18, wherein the display unit comprises
a thin film transistor comprising:
a semiconductor layer; and
a gate electrode, and
wherein the first metal layer is at a layer at a same level as the gate electrode.

* * * * *